United States Patent
Long et al.

(10) Patent No.: US 7,165,340 B2
(45) Date of Patent: Jan. 23, 2007

(54) FEEDING ORGANIC MATERIAL TO A HEATED SURFACE

(75) Inventors: Michael Long, Hilton, NY (US); Bruce E. Koppe, Caledonia, NY (US); Thomas W. Palone, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/050,934

(22) Filed: Feb. 4, 2005

(65) Prior Publication Data

US 2006/0174509 A1    Aug. 10, 2006

(51) Int. Cl.
*F26B 19/00* (2006.01)
(52) U.S. Cl. .................. 34/61; 34/68; 427/255.6; 118/716
(58) Field of Classification Search .................. 34/360, 34/576, 60, 61, 68; 427/255.6; 118/716
See application file for complete search history.

(56) References Cited

U.S. PATENT DOCUMENTS

| | | | |
|---|---|---|---|
| 2,447,789 A | 8/1948 | Barr | |
| 2,487,039 A * | 11/1949 | Belchetz | 423/444 |
| 4,769,292 A | 9/1988 | Tang et al. | |
| 4,885,211 A | 12/1989 | Tang et al. | |
| 5,540,780 A * | 7/1996 | Haas et al. | 118/715 |
| 5,705,226 A * | 1/1998 | Fukui et al. | 427/250 |
| 6,827,786 B1 * | 12/2004 | Lord | 118/716 |
| 2005/0220675 A1 * | 10/2005 | Reed et al. | 422/100 |

FOREIGN PATENT DOCUMENTS

EP    0 982 411    3/2000

* cited by examiner

Primary Examiner—S. Gravini
(74) Attorney, Agent, or Firm—Raymond L. Owens

(57) ABSTRACT

Apparatus for vaporization of powdered material, includes one or more containers each containing possibly distinct powdered materials each having at least one component; a structure for fluidizing the powdered material in each container; a vaporization zone that is thermally isolated from at least one of the containers; a transporting structure for receiving fluidized powdered material from each container and delivering such fluidized powdered materials to the vaporization zone; and vaporizing the delivered powdered materials at the vaporization zone by applying heat.

11 Claims, 3 Drawing Sheets

FEEDING ORGANIC MATERIAL TO A HEATED SURFACE

CROSS REFERENCE TO RELATED APPLICATIONS

Reference is made to commonly assigned U.S. patent application Ser. No. 10/945,941 filed Sep. 21, 2004, entitled "Delivering Organic Powder to a Vaporization Zone" by Long et al, and U.S. patent application Ser. No. 11/050,924 filed concurrently herewith, entitled "Controllably Feeding Organic Material In Making OLEDS" by Long et al, the disclosures of which are herein incorporated by reference.

FIELD OF THE INVENTION

The present invention relates to making organic light emitting diode (OLED) devices and more particularly to controllably feeding organic material to a heated surface.

BACKGROUND OF THE INVENTION

An OLED device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Physical vapor deposition in a vacuum environment is the principal means of depositing thin organic material films as used in small molecule OLED devices. Such methods are well known, for example Barr in U.S. Pat. No. 2,447,789 and Tanabe et al. in EP 0 982 411. The organic materials used in the manufacture of OLED devices are often subject to degradation when maintained at or near the desired rate-dependent vaporization temperature for extended periods of time. Exposure of sensitive organic materials to higher temperatures can cause changes in the structure of the molecules and associated changes in material properties.

To overcome the thermal sensitivity of these materials, only small quantities of organic materials have been loaded in sources and they are heated as little as possible. In this manner, the material is consumed before it has reached the temperature exposure threshold to cause significant degradation. The limitations with this practice are that the available vaporization rate is very low due to the limitation on heater temperature, and the operation time of the source is very short due to the small quantity of material present in the source. In the prior art, it has been necessary to vent the deposition chamber, disassemble and clean the vapor source, refill the source, reestablish vacuum in the deposition chamber and degas the just-introduced organic material over several hours before resuming operation. The low deposition rate and the frequent and time consuming process associated with recharging a source has placed substantial limitations on the throughput of OLED manufacturing facilities.

A secondary consequence of heating the entire organic material charge to roughly the same temperature is that it is impractical to mix additional organic materials, such as dopants, with a host material unless the vaporization behavior and vapor pressure of the dopant is very close to that of the host material. This is generally not the case and as a result, prior art devices frequently require the use of separate sources to co-deposit host and dopant materials.

A consequence of using single component sources is that many sources are required in order to produce films containing a host and multiple dopants. These sources are arrayed one next to the other with the outer sources angled toward the center to approximate a co-deposition condition. In practice, the number of linear sources used to co-deposit different materials has been limited to three. This restriction has imposed a substantial limitation on the architecture of OLED devices, increases the necessary size and cost of the vacuum deposition chamber and decreases the reliability of the system.

Additionally, the use of separate sources creates a gradient effect in the deposited film where the material in the source closest to the advancing substrate is over represented in the initial film immediately adjacent the substrate while the material in the last source is over represented in the final film surface. This gradient co-deposition is unavoidable in prior art sources where a single material is vaporized from each of multiple sources. The gradient in the deposited film is especially evident when the contribution of either of the end sources is more than a few percent of the central source, such as when a co-host is used.

A further limitation of prior art sources is that the geometry of the interior of the vapor manifold changes as the organic material charge is consumed. This change requires that the heater temperature change to maintain a constant vaporization rate and it is observed that the overall plume shape of the vapor exiting the orifices can change as a function of the organic material thickness and distribution in the source, particularly when the conductance to vapor flow in the source with a full charge of material is low enough to sustain pressure gradients from non-uniform vaporization within the source. In this case, as the material charge is consumed, the conductance increases and the pressure distribution and hence overall plume shape improve.

SUMMARY OF THE INVENTION

It is therefore an object of the present invention to provide an effective way to vaporize powders.

This object is achieved by an apparatus for vaporization of powdered material, comprising:

(a) one or more containers each containing possibly distinct powdered materials each having at least one component;

(b) means for fluidizing the powdered material in each container;

(c) means defining a vaporization zone that is thermally isolated from at least one of the containers;

(d) transporting means for receiving fluidized powdered material from each container and delivering such fluidized powdered materials to the vaporization zone; and (e) means for vaporizing the delivered powdered materials at the vaporization zone by applying heat.

BRIEF DESCRIPTION OF THE DRAWINGS

FIG. 1 is a cut-away illustration of a second embodiment of the invention;

DETAILED DESCRIPTION OF THE INVENTION

Figure 1:
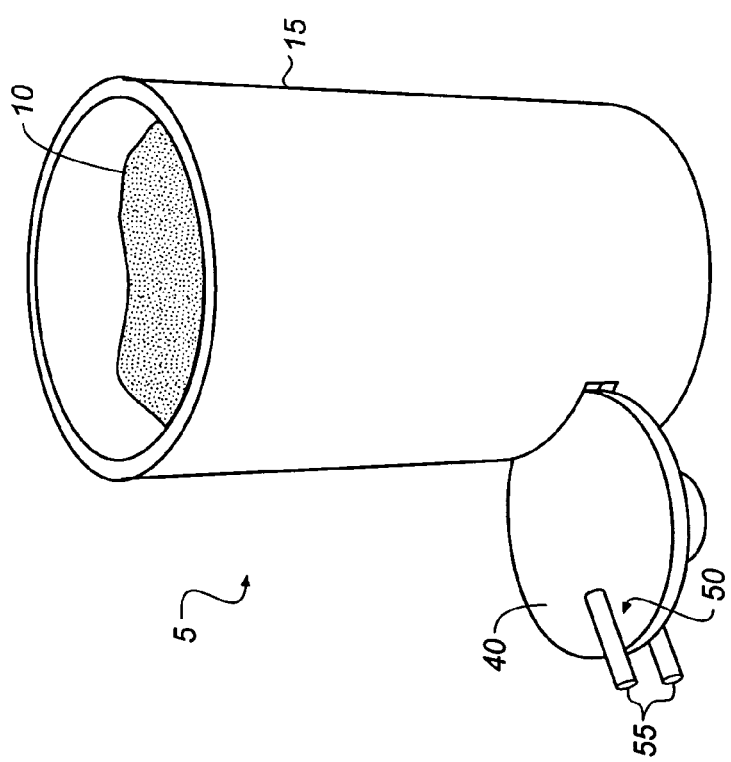
FIG. 1 illustrates a first embodiment of the invention.

Turning now to FIG. 1, an apparatus 5 for precision controlled evaporation of powdered material 10 is shown. The apparatus includes a container which contains a fluidized powdered material 10 having at least one component. A transporting arrangement, implemented here as a rotating disk 40, receives fluidized powdered material 10 from the container 15. The powdered material 10 is transported by the rotating disk 40 to a vaporization zone 50 where a heat source 55 flash evaporates the transported fluidized powdered material. The vaporization zone 50 is defined to be isolated from the container 15 by eliminating conductive heat paths between the heat source 55 and the container 15. For OLED applications, the apparatus 5 would be placed in a vacuum which eliminates convective transport as well. Further isolation is achieved by utilizing low thermal mass, low specific heat, low thermal conductivity materials to produce the rotating disk 40. Radiative heating of the container 15 can be reduced or eliminated by appropriate design of the heat source 55 or by interposing a thermally grounded shield between the heat source 55 and the container 15.

The rotating disk 40 is positioned so that a portion of the rotating disk 40 can rotate through the container 15. The rotating disk 40 is charged with an electrostatic charge so that as it rotates through the fluidized powdered material 10 and the powdered material 10 is attracted to the rotating disk 40. As the rotating disk 40 rotates, the electrostatically attracted powdered material 10 is carried to the heating zone 50 and between a pair of heat sources 50. The rotating disk 40 is maintained at a temperature below the vaporization temperature of the powdered material 10 and is preferably made of a material with low thermal conductivity, low specific heat, and low thermal mass.

Figure 2:
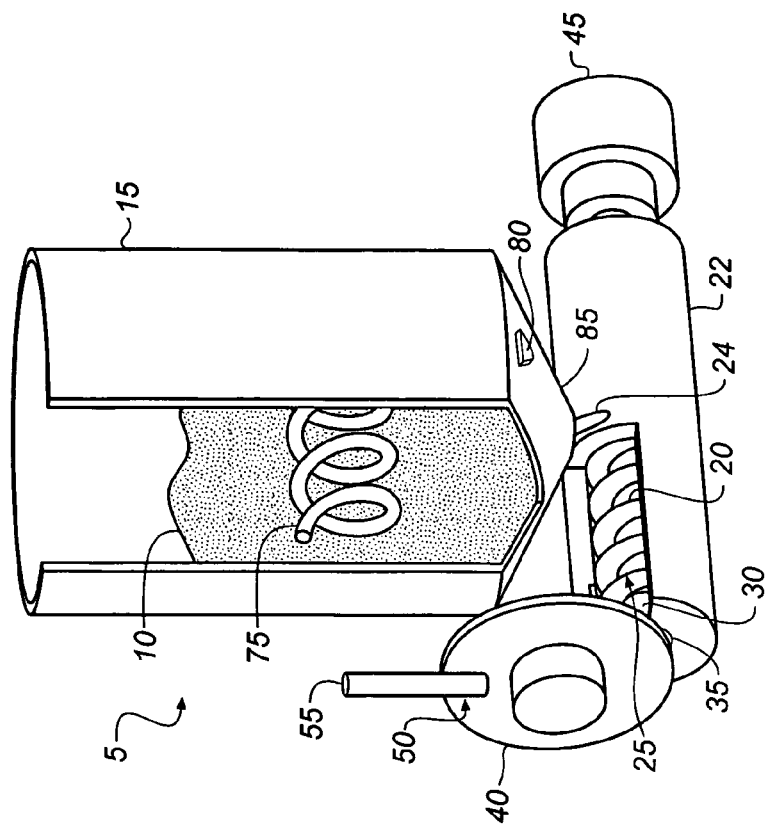

Turning now to FIG. 2, an alternative embodiment of the invention is shown. The apparatus 5 includes a container 15 which contains powdered material 10 having at least one component. An agitator screw 75 can be placed in the container 15 to fluidize the powdered material 10. In addition, one or more vibratory actuators 80 can be placed on a funnel 85 (formed by the container 15) to improve the flow of the fluidized powdered material 10 from the container 15 into an auger enclosure 22. In this context fluidized material is a material that is capable of flowing in a fluid-like manner. In this embodiment the transporting arrangement includes a first transporting mechanism and a second transporting mechanism. The first transporting mechanism, is implemented here as a rotatable auger 20 and is disposed in the auger enclosure 22 which in turn is disposed in a material receiving relationship with the container 15. The auger enclosure 22 has openings 24 for receiving fluidized powdered material 10 from the container 15. The rotatable auger 20 moves fluidized powdered material 10 along a feed path 25 to a delivery zone 30. Rotation of the rotatable auger 20 by a motor 45 causes the fluidized powered material 10 to be subject to pressure at the delivery zone 30; such pressure forces the fluidized powered material 10 through one or more openings 35 formed in a member 36. The member 36 can be a part of the auger enclosure 22 and forces the powdered material 10 into contact with the second transporting mechanism, implemented here as a rotating disk 40. The powdered material 10 is transported by the rotating disk 40 to a heating zone 50 where a heat source 55 flash evaporates the powdered material 10 transported by the second transporting mechanism.

The rotating disk 40 is maintained at a temperature below the effective vaporization temperature of the powder material 10 and its rotation carries a controllable quantity of powdered material 10 at a controllable velocity from the auger screw 20 to a location where heat is applied so as to rapidly vaporize all of the transported powdered material 10 at a very localized portion of the rotating disk 40. Choosing a rotating disk 40 having low thermal conductivity, low specific heat and low thermal mass concentrates the heat in a localized area and produces a high thermal gradient that permits flash vaporization to occur. As in the previous embodiment, the powdered material 10 is thermally isolated from the heat source 55 by the elimination of conductive and convective paths. Alternatively, there is an option of interposing a shield that acts to block radiative heating.

Figure 3:
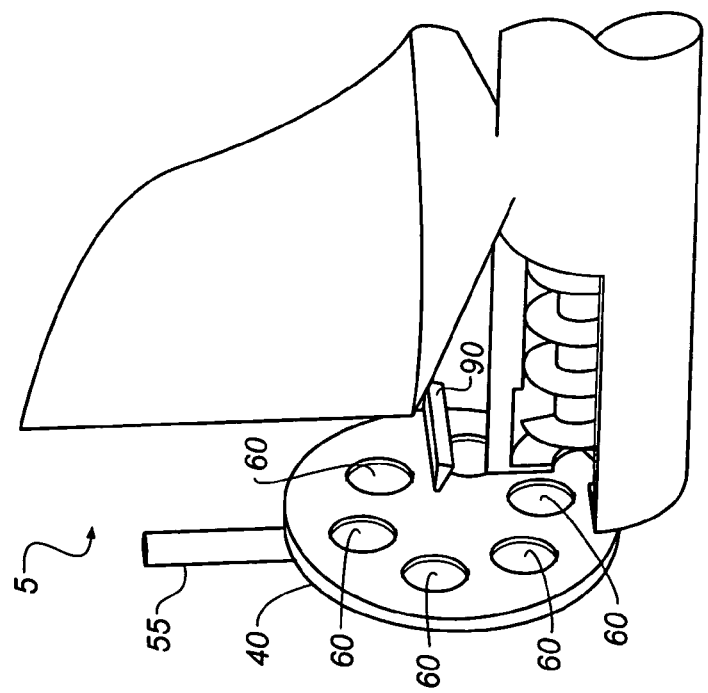
FIG. 3 is a detailed view from a different direction of a portion of the embodiment shown in FIG. 2.

FIG. 3 provides a detailed view of the rotating disk 40. A plurality of recesses 60 are apparent from this viewpoint. Each recess 60 carries a predetermined quantity of powdered material 10 from the delivery zone 30 to the heating zone 50 as the rotating disk 40 rotates. A doctor blade 90 is used utilized to ensure a repeatable fill in each of the recesses 60 in the face of the rotating disk 60 as well as to remove powdered material 10 adhering to the rotating disk 40 in the regions between recesses 60. A recess 60 in the rotating disk 40 is not the only way powered material 10 may be carried from the heating source 55. The face of the rotating disk 40 can be featured so as to retain a determinate volume of powder much like a Gravure roll. The rotating disk 40 can be constructed of a flexible or rigid porous material such as an electroform, a sintered material or a screen, all of which may contain openings or recesses designed to capture fluidized powdered material 10. Alternately, a thin rotating disk 40 can have a non-porous construction where features are embossed, cut, or etched into at least one of its faces to acquire and retain powder material 10 in a number of voids. Electrostatic attraction can be used effectively to cause essentially all of the powder material 10 to adhere to the rotating disk 40 as it is abraded off of the extruded powdered material 10. The rotating disk 40 can be covered by a screen, providing a plurality of recesses into which powder material 10 may be received at the delivery zone 30 and carried to the heating zone 50. Although the recesses 60 are shown as having substantially the same size, it can be desirable to have recesses of different sizes. The transporting mechanisms can be single stage or a plurality of stages and can take any of the many forms known within the field of powder material transport.

Figure 4:
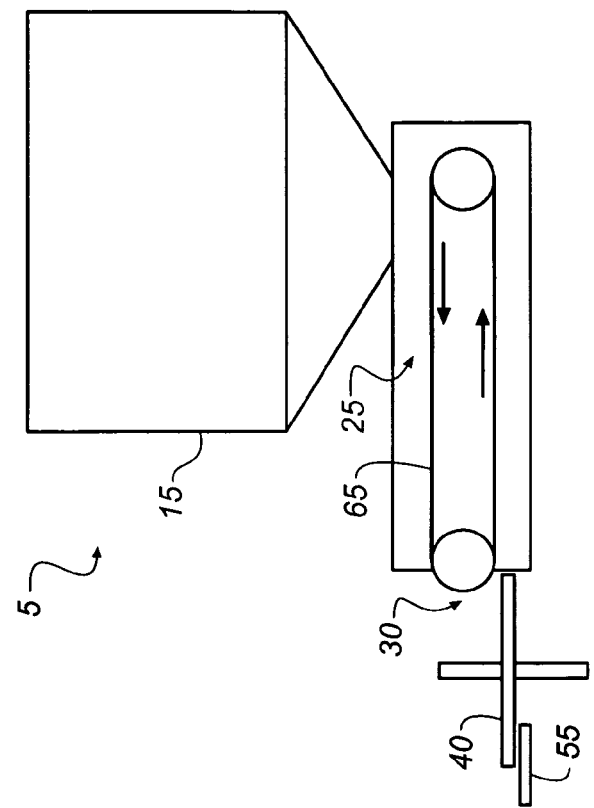
FIG. 4 is a section view of an alternative embodiment of the invention.

FIG. 4 shows a section view of an alternative embodiment of the invention. In this embodiment a translational mechanism, implemented as a belt 65, replaces the auger in the feed path 25. At the end of the feed path 25 in the delivery zone 30 the force of gravity feeds the powdered material 10 from the belt 65 onto the rotating disk 40 which is horizontally configured. The rotating disk 40 takes the powdered material 10 from the delivery zone 30 to the heating zone 50 where it is flash evaporated. The belt 65 can contain individual recesses for receiving powdered material 10, it can be a smooth belt, or it can have any of the powder retention mechanisms discussed in the description of FIG. 3.

Figure 5:
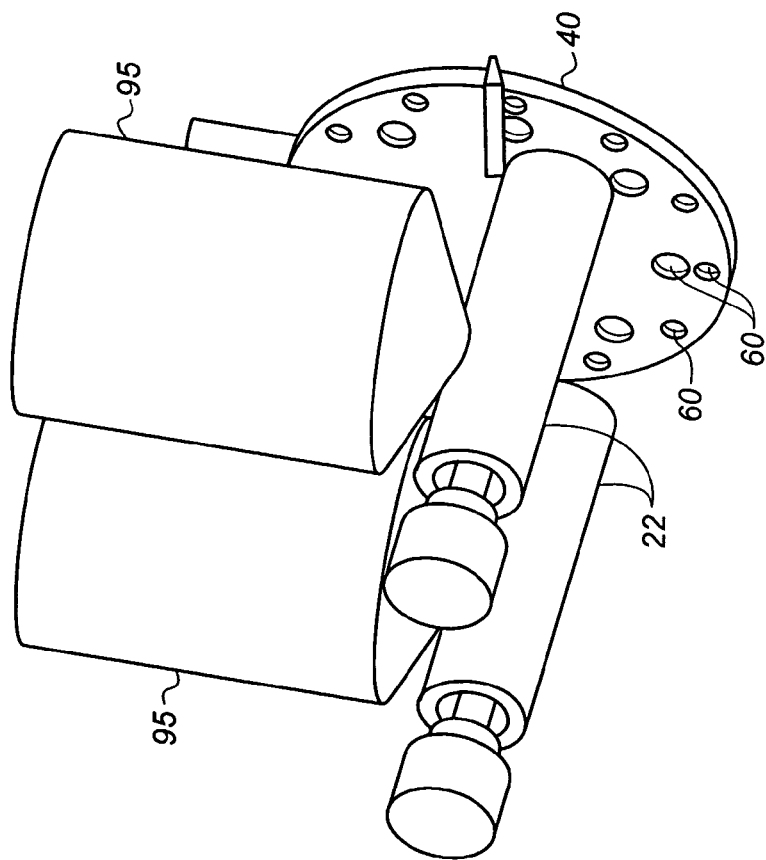
FIG. 5 is a detailed view of a variation of the embodiment in FIG. 2.

FIG. 5 shows another embodiment of the invention including two containers 95. The containers 95 can each contain the same or different powdered materials 10. The rotating disk 40 contains recesses 60 which in this figure are two distinct sizes, permitting a controlled, but distinct, amount of powder material 10 to be dispensed from separate augers disposed in auger enclosures similar to FIG. 2.

Figure 6:
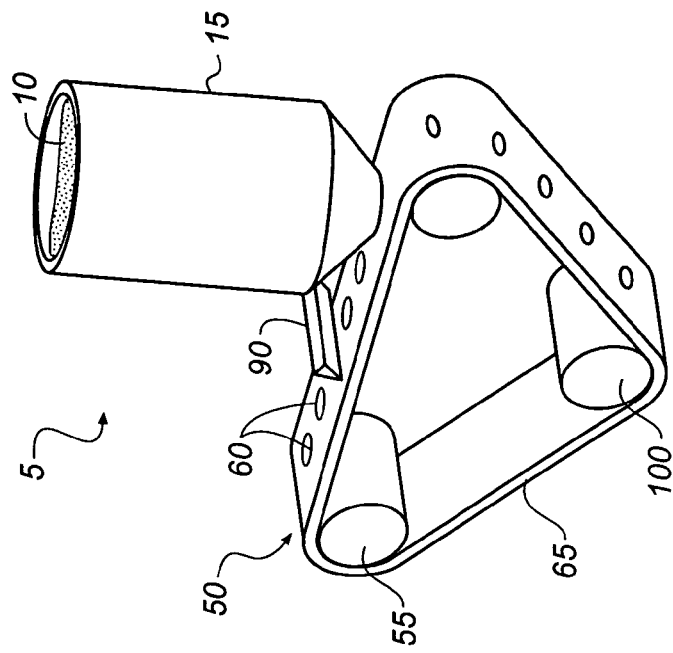
FIG. 6 illustrates an alternative embodiment of the invention.

FIG. 6 illustrates another embodiment of the invention that utilizes a single stage of transport. The apparatus 5 includes a container 15 containing a fluidized powder. A translational mechanism in the form of a belt 65 receives powdered material 10 from the container 15. The powered material 10 drops onto the belt and into recesses 60. A doctor blade 90 insures that each recess 60 contains a uniform amount of powdered material 10 while also removing excess powdered material 10 from the surface of the belt 65 around and between the recesses 60. In this particular embodiment the heat source 55 takes the form of one of the support rollers for the belt 65. A heat sink 100 is interposed as an idler roller to provide thermal isolation between the heat source 55 and the container 15 having the fluidized powdered material 10.

The invention has been described in detail with particular reference to certain preferred embodiments thereof, but it will be understood that variations and modifications can be effected within the spirit and scope of the invention.

PARTS LIST

5 Apparatus
10 Powdered material
15 Container
20 Rotatable auger
22 Auger enclosure
24 Auger enclosure opening
25 Feed path
30 Delivery zone
35 Opening
36 Member
40 Rotating disk
45 Motor
50 Vaporization zone
55 Heat source
60 Recess
65 Belt
75 Agitator screw
80 Vibratory actuator
85 Funnel
90 Doctor blade
95 Containers
100 Heat sink

The invention claimed is:

1. Apparatus for vaporization of powdered material, comprising:

(a) one or more containers each containing possibly distinct powdered materials each having at least one component;

(b) means for fluidizing the powdered material in each container;

(c) means defining a vaporization zone that is thermally isolated from at least one of the containers;

(d) transporting means for receiving fluidized powdered material from each container and delivering such fluidized powdered materials to the vaporization zone; and (e) means for vaporizing the delivered fluidized powdered materials at the vaporization zone by applying heat.

2. The apparatus according to claim 1 where the transporting means is divided into a first stage transporting means and a second stage transporting means.

3. The apparatus of claim 2 where the first stage transporting means includes an auger mechanism or a translational member.

4. The apparatus of claim 2 where the second stage transporting means includes a rotating disk or a translational member.

5. The apparatus according to claim 1 where the transporting means has a single stage and includes a rotating disk or translational member.

6. The apparatus of claim 1 where the transporting means contains a plurality of cells, each cell receiving a predetermined amount of fluidized powder material.

7. The apparatus of claim 6 where the cells have at least one first size receiving a first predetermined amount of fluidized powder material and at least a second size receiving a second predetermined amount of fluidized powder material.

8. The apparatus of claim 7 where the fluidized powder material in the cell of the first size is delivered from a first container of fluidized powder material and the fluidized powder in the cell of the second size is delivered from a second container of fluidized powder material, where the fluidized powder material of the first container is different from the fluidized powder material of the second container.

9. The apparatus of claim 1 wherein the transporting means includes a screen having openings and the openings are sized to capture fluidized powdered material.

10. The apparatus of claim 6 further including wiping means for removing excess fluidized powder material from the cells and from interstitial areas between cells.

11. The apparatus of claim 1 wherein the transport means includes a moveable member and means for electrostatically transferring fluidized powdered material to the moveable member from the container.

* * * * *